United States Patent [19]

Rubner et al.

[11] 4,287,294

[45] Sep. 1, 1981

[54] METHOD FOR THE PREPARATION OF RELIEF STRUCTURES BY PHOTOTECHNIQUES

[75] Inventors: Roland Rubner, Röttenbach; Eberhard Kühn, Hemhofen; Hellmut Ahne, Röttenbach, all of Fed. Rep. of Germany

[73] Assignee: Siemens Aktiengesellschaft, Munich, Fed. Rep. of Germany

[21] Appl. No.: 148,129

[22] Filed: May 9, 1980

[30] Foreign Application Priority Data

May 16, 1979 [DE] Fed. Rep. of Germany ....... 2919841

[51] Int. Cl.$^3$ ............................................... G03C 5/00
[52] U.S. Cl. .................................... 430/306; 430/281; 430/287; 430/322; 430/919
[58] Field of Search ............... 430/281, 287, 306, 322, 430/919

[56] References Cited

U.S. PATENT DOCUMENTS

| Re. 30,186 | 1/1980 | Rubner et al. | 430/283 |
|---|---|---|---|
| 3,475,176 | 10/1969 | Rauner | 204/159.2 |
| 3,957,512 | 5/1976 | Kleeberg et al. | 430/311 |
| 3,979,426 | 9/1976 | Demajistre | 204/159.22 |

*Primary Examiner*—Jack P. Brammer
*Attorney, Agent, or Firm*—Kenyon & Kenyon

[57] ABSTRACT

The invention relates to a method for making more efficient the preparation of relief structures by phototechniques from mixtures containing olefinically unsaturated polymers and azides as photo initiators. For this purpose, the invention provides the use of aromatic azidomaleinimides as photo initiators. The method according to the invention is suitable particularly for the structuring by phototechniques of insulating materials as well as of semiconductor and conductor materials.

6 Claims, No Drawings

METHOD FOR THE PREPARATION OF RELIEF STRUCTURES BY PHOTOTECHNIQUES

BACKGROUND OF THE INVENTION

The invention relates to a method for the preparation of relief structures by phototechniques from mixtures containing olefinically unsaturated polymers and azides as photo initiators.

One of the most accurate structuring methods for insulating materials, semiconductor and conductor materials in electrical engineering is the phototechnique. Here, resist relief structures generated by phototechniques are copied on substrates by suitable processes such as etching, vapor deposition and electroless or electroplating metallization. Resist relief structures can furthermore take over permanent protection functions, for instance, as insulation.

In a method know from U.S. Pat. No. 3,957,512 and U.S. Pat. No. Re. 30,186, both incorporated herein by reference, relief structures are made from highly heat-resistant polymers. To this end, radiation-sensitive soluble preliminary polymers in the form of a layer or foil are applied to a substrate; the radiation-sensitive layer or foil is then irradiated through negative patterns; and subsequently, the non-irradiated layer or foil portions are removed from the substrate. If necessary, this can be followed by tempering or annealing of the relief structure obtained. In this method, polyaddition or polycondensation products of polyfunctional carbocyclic or heterocyclic compounds carrying radiation-sensitive radicals with diamines, diisocyanates, bis-acid chlorides or dicarboxylic acids are used as soluble preliminary polymers. The compounds carrying the radiation-sensitive radicals contain two carboxyl, carboxylic-acid chloride, amino, isocyanate or hydroxyl groups suitable for addition or condensation reactions, and, partially in ortho- or peri-position thereto, radiation-reactive groups bound to carboxyl groups as esters. According to U.S. Pat. No. Re. 30,186, these radiation-reactive groups are oxyalkylene-acrylate or oxyalkylene-methacrylate groups.

The light sensitivity of resist materials such as photo-reactive polymers can be increased further by the addition of photo-initiators and photo-sensitizers. This is important because the economics of structuring of surfaces by phototechniques dictate that the time for which the expensive exposure devices are used be as brief as possible, i.e., the sensitivity of the photoresists used is as high as possible. In the known method, compounds such as Michler's ketone, i.e., 4,4'-bis(dimethylamino)-benzophenone, benzoine ether, 2-tert-butyl-9,10-anthraquinone; 1,2-benz-9,10-anthraquinone and bis(-diethylamino)benzophenone are added to the preliminary polymer stages for this purpose.

It is known to use azides as photo-initiators for resists, especially negative resists, with diallylphthalate prepolymers, polyisoprene resins and polyvinylcinnamates as polymers or preliminary polymers (see: W. S. DeForest, "Photoresist", McGraw-Hill Book Company, 1975, pages 35 to 41). As photo-initiators, generally diazides with the following structure have been used:

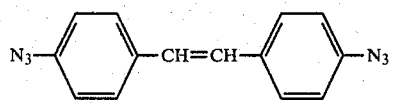

4,4'-Diazidostilbene

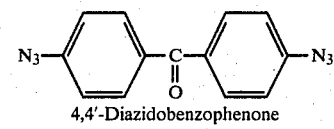

4,4'-Diazidobenzophenone

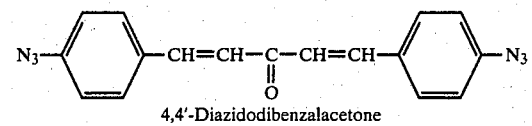

4,4'-Diazidodibenzalacetone

SUMMARY OF THE INVENTION

It is an object of the present invention to further increase the photo-reactivity of mixtures which contain olefinically unsaturated polymers and, as photo-initiators, azides, in order to render the preparation of relief structures by phototechniques still more efficient.

According to the invention this is achieved through the use of aromatic azidomaleinimides as photo-initiators. Within the scope of the present invention, the term "aromatic" is intended to include benzene derivatives including anellated, i.e., condensed ring systems.

The method according to the present invention permits efficient production of organic relief structures by brief selective irradiation of film layers and subsequent separation of the unexposed film portions. This is possible because the olefinically unsaturated polymers become more photo-reactive through the addition of azidomaleinimides.

The following compounds may be used, for example, as photo-initiators: 3- or 4-azidophenyl maleinimide; 3-azido-3'-maleinimido-diphenyl methane or the corresponding 4,4'-compound; and 4-azido-4'-maleinimido diphenyl ether.

Preferred compounds for use in the method according to the present invention are the aromatic azidosulfonyl maleinimides, for example, azidosulfonyl phenyl-maleinimide, 2-(N-maleinimido)-naphthyl-5-sulfonyla-zide and 2-(N-maleinimido)-naphthyl-6,8-bissulfonyla-zide. Such compounds, which are described in our concurrently-filed, commonly assigned U.S. Patent Application Ser. No. 148,142 ... entitled "N-Azidosulfonyla-ryl-Maleinimide And The Use Thereof" filed May 9, 1980, are thermally stable and, thus, allow a wide processing latitude.

Sensitizers, such as Michler's ketone, can also be added advantageously to the photo-reactive mixture. In this manner, the light sensitivity of the mixture is increased still further. Olefinically unsaturated polymers which can be used in the method of the present invention include diallylphthalate prepolymers, polycinnamates and polyisoprene resins. In particular, however, acrylate- and/or methacrylate-group-containing polymers are used.

DETAILED DESCRIPTION OF THE INVENTION

The invention is described and explained in greater detail with the aid of the following examples.

EXAMPLE 1 (Reference Test)

From pyromellithic acid dianhydride, methacrylate acid-2-hydroxy-ethyl ester and 4,4'-diaminodiphenyl ether, a soluble preliminary polymer is prepared in accordance with U.S. Pat. Re. 30,186 in the form of a polyamido carboxylic acid methacrylate with the following structure (methacrylate resin):

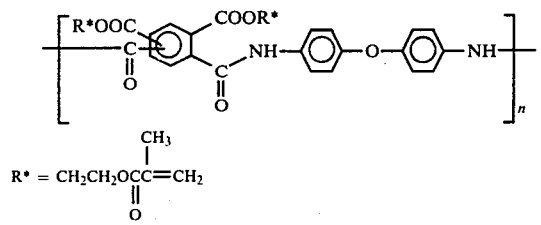

10 parts by weight of the methacrylate resin are dissolved together with 0.5 parts by weight N-phenyl-maleinimide and 0.2 parts by weight Michler's ketone in 22 parts (by volume) of a mixture of dimethylacetamide and dioxane (volue ratio 1:1). The solution is then filtered and centrifuged on aluminum foils to form uniform films. After drying for 1½ hours at 60° C. in a vacuum, the thickness of the film is 6 μm. The films obtained in this manner are exposed with a 500-W very-high pressure mercury lamp through a contact copy. With an exposure time of 60 to 75 seconds and after development with a 1:1 mixture of γ-butyrolactone and toluene (development time 16 seconds), relief structures with sharp edges and a resolution of 10 μm are obtained. These patterns are tempered for one hour at 340° C., the resolution and the edge sharpness of the relief structures not being impaired.

EXAMPLE 2

10 parts by weight of the methacrylate resin described in Example 1 are used together with 0.2 parts by weight azidosulfonylphenyl maleinimide and 0.2 parts by weight Michler's ketone for producing films with a thickness of 6 μm in accordance with the method of Example 1. With such films, relief structures with sharp edges are obtained after an exposure time of only 30 seconds, under the exposure and development conditions given in Example 1.

EXAMPLE 3 (Reference Test)

10 parts by weight of a commercially obtainable diallylphthalate prepolymer are dissolved together with 0.75 parts by weight N-phenyl-maleinimide and 0.1 parts by weight Michler's ketone in 20 parts (by volume) of a mixture of dimethyl acetamide and dioxane (volume ratio 1:1). The solution is then filtered and centrifuged on aluminum foils to form uniform films. After the solvent is removed in a vacuum, the film thickness is 6 μm. The films obtained in this manner are then exposed with a 500-W very-high-pressure mercury lamp through a contact copy. After an exposure time of 20 to 30 seconds and development with a 1:1 mixture of 1,1,1-trichloroethane and trichloroethylene (development time 30 seconds), relief structures with sharp edges are obtained.

EXAMPLE 4

10 parts by weight of the diallylphthalate prepolymer of Example 3 are used together with 0.2 parts by weight azidophenyl maleinimide and 0.1 parts by weight Michler's ketone according to the method of Example 3 for the preparation of films with a thickness of 6 μm. With such films, relief structures with sharp edges are obtained after an exposure time of only 10 seconds, under the exposure and development conditions given the Example 3.

EXAMPLE 5

10 parts by weight of the diallylphthalate prepolymer of Example 3 are used together with 0.2 parts by weight azidosulfonylphenyl maleinimide and 0.1 parts by wieght Michler's ketone according to the method of Example 3 for the preparation of films with a thickness of 6 μm. With such films, relief structures with sharp edges are obtained after an exposure time of only 6 seconds, under the exposure and development conditions given in Example 3.

EXAMPLE 6 (Reference Test)

From pyromellithic acid dianhydride, allyl alcohol diaminodiphenyl and 4,4′ diaminodiphenyl ether, a soluble preliminary polymer stage in the form of a polyamido carboxylic acid allyl ester of the following structure

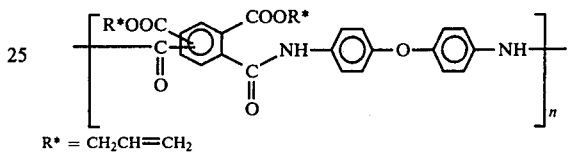

was parepared in accordance with U.S. Pat. No. 3,957,512 (allyl ester resin).

10 parts by weight of the allyl ester resin are dissolved together with 0.5 parts by weight N-phenyl-maleinimide and 0.1 parts by weight Michler's ketone in 40 parts (by volume) dimethylacetamide. The solution is then filtered and centrifuged on aluminum foils to form films with a thickness of 5 μm. These films are then exposed with a 500-W very high-pressure mercury lamp through a contact copy for 11 minutes and then developed for 30 seconds with γ-butyrolactone. Structures with a resolution of 10 μm were obtained.

EXAMPLE 7

By means of a reaction solution which contains 10 parts by weight of the allyl ester resin of Example 6, 0.1 parts by weight azidosulfonylphenyl maleinimide and 0.1 parts by weight Michler's ketone, films 5 μm thick are produced on aluminum foils. With the same exposure and development conditions as in Example 6, an exposure time of only 8 minutes is required to prepare from such films relief structures with sharp edges.

EXAMPLE 8 (Reference Test)

5 parts by weight of a phenoxy resin polycinnamate, prepared from a commercially available phenoxy resin with a molecular weight of 20,000 to 25,000 by esterification with cinnamic acid chloride, are dissolved together with 0.05 parts by weight Michler's ketone in 20 parts (by volume) dioxane and the solution is centrifuged on aluminum foils to form uniform films. After the solvent is removed, the film thickness is 7 μm. Exposure with a 500-W very-high-pressure mercury lamp through a contact mask results, after an exposure time of 90 seconds, in an image which can be developed with toluene in 25 seconds. The structures so obtained have good edge sharpness.

EXAMPLE 9

When 0.2 parts by weight azidosulfonylphenyl maleinimide are added to the reaction solution according to Example 8, relief stuctures with sharp edges are obtained under the conditions there given after an exposure time of only 10 seconds.

What is claimed is:

1. In a method for the preparation of relief structures by phototechniques wherein a mixture of (i) a photo-or radiation-reactive olefinically unsaturated polymer and (ii) as a photo-initiator, an azide is applied in the form of a layer or foil to a substrate; the layer or foil is exposed or irradiated through a mask; and the non-exposed or non-irradiated portions of the layer or foil are removed from the substrate to obtain a relief structure, the improvement comprising utilizing as said photo-initiator an aromatic azidomaleinimide.

2. The method according to claim 1 wherein said azidomaleinimide comprises an azidosulfonyl maleinimide.

3. The method according to claim 1 wherein said mixture further comprises a sensitizer.

4. The method according to claim 3 wherein said sensitizer comprises 4,4'-bis(dimethylamino)-benzophenone.

5. The method according to claim 1 wherein said olefinically unsaturated polymer comprises an acrylate- and/or methacrylate-group-containing polymer.

6. The method of claim 4 wherein said relief structure obtained is subsequently annealed.

* * * * *